United States Patent
Matsumoto et al.

(10) Patent No.: US 9,059,178 B2
(45) Date of Patent: Jun. 16, 2015

(54) METHOD FOR FORMING CARBON NANOTUBES AND CARBON NANOTUBE FILM FORMING APPARATUS

(71) Applicant: Tokyo Electron Limited, Minato-ku (JP)

(72) Inventors: Takashi Matsumoto, Yamanashi (JP); Masahito Sugiura, Yamanashi (JP); Kenjiro Koizumi, Yamanashi (JP); Yusaku Kashiwagi, Yamanahi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 117 days.

(21) Appl. No.: 13/665,724

(22) Filed: Oct. 31, 2012

(65) Prior Publication Data
US 2013/0059091 A1    Mar. 7, 2013

Related U.S. Application Data

(63) Continuation of application No. PCT/JP2011/060386, filed on Apr. 28, 2011.

(30) Foreign Application Priority Data

Apr. 30, 2010 (JP) ................. 2010-105456

(51) Int. Cl.
C23C 14/02 (2006.01)
H05H 1/00 (2006.01)
(Continued)

(52) U.S. Cl.
CPC ........... *H01L 23/53276* (2013.01); *B82Y 30/00* (2013.01); *B82Y 40/00* (2013.01);
(Continued)

(58) Field of Classification Search
CPC ....... B82Y 30/00; B82Y 40/00; B01J 23/462; B01J 23/75; B01J 23/755; B01J 23/745; B01J 23/74
USPC ................. 427/534, 535, 539, 569, 575, 576; 977/842, 843, 844
See application file for complete search history.

(56) References Cited

U.S. PATENT DOCUMENTS 6,221,154 B1 * 4/2001 Lee et al. .......................... 117/87
7,115,184 B2 * 10/2006 Ohmi et al. ............... 156/345.33
(Continued)

FOREIGN PATENT DOCUMENTS

CN    1545486    11/2004
JP    2007-252970    10/2007
(Continued)

OTHER PUBLICATIONS

International Search Report Issued Jun. 7, 2011 in PCT/JP2011/060386 filed Apr. 28, 2011.
(Continued)

*Primary Examiner* — Michael Wieczorek
(74) *Attorney, Agent, or Firm* — Oblon, McClelland, Maier & Neustadt, L.L.P.

(57) ABSTRACT

A method for forming carbon nanotubes includes preparing a target object having a surface on which one or more openings are formed, each of the openings having a catalyst metal layer on a bottom thereof; performing an oxygen plasma process on the catalyst metal layers; and activating the surfaces of the catalyst metal layers by performing a hydrogen plasma process on the metal catalyst layers subjected to the oxygen plasma process. The method further includes filling carbon nanotubes in the openings on the target object by providing an electrode member having a plurality of through holes above the target object in a processing chamber, and then growing the carbon nanotubes by plasma CVD on the activated catalyst metal layer by diffusing active species in a plasma generated above the electrode member toward the target object through the through holes while applying a DC voltage to the electrode member.

20 Claims, 9 Drawing Sheets

(51) Int. Cl.
*H01L 23/532* (2006.01)
*B82Y 30/00* (2011.01)
*B82Y 40/00* (2011.01)
*C01B 31/02* (2006.01)
*H01L 21/285* (2006.01)
*H01L 21/768* (2006.01)
*H01L 23/522* (2006.01)

(52) U.S. Cl.
CPC ..... *C01B 31/0226* (2013.01); *H01L 21/28556* (2013.01); *H01L 21/76879* (2013.01); *H01L 23/5226* (2013.01); *H01L 2221/1094* (2013.01); *H01L 2924/0002* (2013.01)

(56) References Cited

U.S. PATENT DOCUMENTS

| | | | |
|---|---|---|---|
| 7,560,136 B2 * | 7/2009 | Ward et al. | 427/122 |
| 2002/0114949 A1 * | 8/2002 | Bower et al. | 428/401 |
| 2006/0162661 A1 * | 7/2006 | Jung et al. | 118/723 ER |
| 2006/0204426 A1 * | 9/2006 | Akins et al. | 423/445 B |
| 2006/0213444 A1 * | 9/2006 | Samukawa et al. | 118/723 ME |
| 2008/0095695 A1 * | 4/2008 | Shanov et al. | 423/447.3 |
| 2009/0131245 A1 * | 5/2009 | Esconjauregui et al. | 502/100 |
| 2009/0320756 A1 | 12/2009 | Tanaka | |
| 2010/0072054 A1 * | 3/2010 | Yamazaki et al. | 204/157.47 |
| 2010/0209617 A1 * | 8/2010 | Lin et al. | 427/535 |
| 2010/0209704 A1 * | 8/2010 | Yamazaki et al. | 428/368 |

FOREIGN PATENT DOCUMENTS

| | | |
|---|---|---|
| JP | 2010-010297 | 1/2010 |
| WO | WO 03/011755 | 2/2003 |

OTHER PUBLICATIONS

M. Meyyappan, et al., "Carbon nanotube growth by PECVD: a review", Plasma Sources Sci. Technol., vol. 12, 2003, pp. 205-216.

\* cited by examiner

FIG. 11A
FIG. 11B
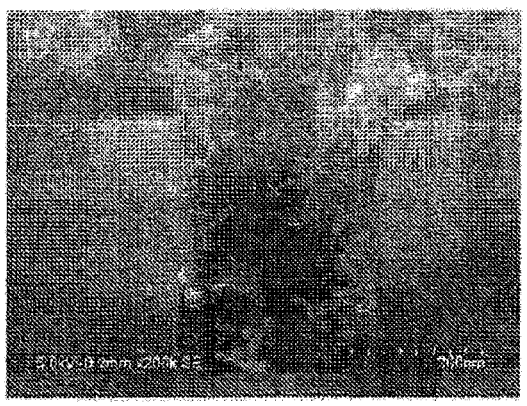
FIG. 12

US 9,059,178 B2

METHOD FOR FORMING CARBON NANOTUBES AND CARBON NANOTUBE FILM FORMING APPARATUS

This application is a Continuation Application of PCT International Application No. PCT/JP2011/060386 filed on Apr. 28, 2011, which designated the United States.

FIELD OF THE INVENTION

The present invention relates to a method for forming carbon nanotubes filled in openings of a target object and a carbon nanotube film forming apparatus.

BACKGROUND OF THE INVENTION

Since carbon nanotubes have good electrical characteristics, the application of carbon nanotubes to the wiring of semiconductor devices and the like has been being examined. As for a method for forming a carbon nanotube film, there is suggested in, e.g., Japanese Patent Application Publication No. 2007-252970, a method for forming carbon nanotubes by forming a catalyst layer made of particles of a transition metal such as Ni, Fe, Co or the like on a substrate and performing thereon plasma CVD using hydrocarbon gas and hydrogen gas. The above-cited reference discloses a technique for activating a surface of a catalyst metal by allowing radicals to act on the surface of the catalyst metal for the purpose of preventing catalyst activation from being deteriorated by oxidation of the surfaces of fine particles when the catalyst metal is atomized.

In order to use carbon nanotubes for via wirings, it is required to reduce defects of the carbon nanotubes and increase the density per unit area. When the density of the carbon nanotubes filled in the openings are low, the following problems are generated. First, fine gaps are formed in the openings and, thus, the conductivity of the via wiring is decreased. Further, when the planarization is performed by, e.g., CMP (chemical mechanical polishing) after the carbon nanotubes are filled in the openings, the carbon nanotubes filled in the openings are separated therefrom. Moreover, when fine gaps are formed in the openings after the carbon nanotubes are filled, the fine gaps need to be filled with, e.g., silicon dioxide films or the like. Hence, the number of processes is increased and the processes are not efficiently performed in view of an industrial scale.

In Japanese Patent Application Publication No. 2007-252970, only the case of forming a carbon nanotube film on a flat surface is disclosed. Therefore, simply by activating a catalyst metal, it is difficult to fill carbon nanotubes in openings such as via holes and the like with a high density.

SUMMARY OF THE INVENTION

In view of the above, the present invention provides a method for forming carbon nanotubes with a high density in openings such as via holes, wiring grooves and the like on a target object to be processed.

In accordance with an aspect of the present invention, there is provided a method for forming carbon nanotubes, including preparing a target object to be processed having a surface on which one or more openings are formed, each of the openings having a catalyst metal layer on a bottom thereof; performing an oxygen plasma process on the catalyst metal layers; activating the surfaces of the catalyst metal layers by performing a hydrogen plasma process on the metal catalyst layers subjected to the oxygen plasma process; and filling carbon nanotubes in the openings on the target object by providing an electrode member having a plurality of through holes above the target object in a processing chamber of a film forming apparatus, and then growing the carbon nanotubes by plasma CVD on the activated catalyst metal layer by diffusing active species in a plasma generated in a space above the electrode member toward the target object through the through holes while applying a DC voltage to the electrode member.

A DC voltage ranging from about −300 V to 0 V may be applied to the electrode member.

A diameter of the through holes of the electrode member may range from about 0.5 mm to 2 mm.

When the carbon nanotubes are grown, the target object may be heated to about 350° to 550° C.

The film forming apparatus may include a first gas inlet configured to introduce a plasma generating gas into the processing chamber; and a second gas inlet configured to introduce a source gas for the carbon nanotubes into the processing chamber, wherein, after the source gas for the carbon nanotubes which is introduced from the second gas inlet is mixed with the plasma generated by the plasma generating gas, active species in the plasma pass through the through holes of the electrode member.

The plasma used for the oxygen plasma process, the hydrogen plasma process and the carbon nanotube growing process may be a microwave plasma.

The microwave plasma may be excited by a microwave introduced into the processing chamber by a planar antenna having a plurality of microwave radiation holes.

The opening of the target object may be a via hole or a wiring groove.

The opening may have a width ranging from about 10 nm to 300 nm.

The oxygen plasma process, the hydrogen plasma process and the carbon nanotube growing process may be successively performed in the same processing chamber.

In accordance with an aspect of the present invention, there is provided a carbon nanotube film forming apparatus including a processing chamber defining a processing space where a plasma process is performed on a target object to be processed; a mounting table configured to mounted thereon the target object in the processing chamber; a first gas inlet configured to introduce a plasma generating gas into the processing chamber; a second gas inlet configured to introduce a source gas for carbon nanotubes into the processing chamber; an electrode member disposed above the mounting table in the processing chamber, the electrode member having a plurality of through holes; a power supply configured to apply a DC voltage to the electrode member; and a gas exhaust unit configured to vacuum-evacuate the processing chamber, wherein the carbon nanotubes are grown by plasma CVD on the target object by diffusing active species in the plasma generated in a space above the electrode member toward the target object through the through holes while applying a DC voltage to the electrode member.

The first gas inlet and the second gas inlet may arranged such that the source gas for the carbon nanotubes is mixed with the plasma generated by the plasma generation gas, and the electrode member may be disposed between the mounting table and a portion where the source gas for the carbon nanotubes is mixed with the plasma.

The apparatus may further include a dielectric member, provided at an upper portion of the processing chamber, for closing the processing space; and a planar antenna, provided above the dielectric member, for introducing a microwave into the processing space via the dielectric member, wherein the first gas inlet is disposed to introduce a gas into a space directly below the dielectric member, wherein the second gas inlet is provided between the dielectric member and the mounting table in such a way as to be closer to the mounting table compared to the first gas inlet, and wherein the electrode member is disposed between the second gas inlet and the mounting table.

A diameter of the through holes of the electrode member may be set within a range from 0.5 mm to 2 mm.

The first gas inlet may be connected to an oxygen-containing gas supply source for performing on the target object oxygen plasma process as one of preprocesses performed before the carbon nanotube growing process using the plasma CVD, and the second gas inlet may be connected to a hydrogen-containing gas supply source for performing on the target object hydrogen plasma process as another one of the preprocesses performed before the carbon nanotube growing process using the plasma CVD.

Based on the method for forming carbon nanotubes and the carbon nanotube film forming apparatus in accordance with the aspects of the present invention, the carbon nanotubes can be filled in the openings on the target object with a high density.

BRIEF DESCRIPTION OF THE DRAWINGS

The objects and features of the present invention will become apparent from the following description of embodiments, given in conjunction with the accompanying drawings, in which:

FIGS. 11A and 11B are scanning electron microscope (SEM) images showing a cross section of a substrate when voltages of about −100 V and −300 V, respectively, are applied to a grid electrode in a carbon nanotubes formation test in Test Example 2; and FIG. 12 is a scanning electron microscope (SEM) image showing a cross section of a substrate when a voltage of about −100 V is applied to a grid electrode in a carbon nanotubes formation test in Test Example 3.

DETAILED DESCRIPTION OF THE EMBODIMENTS

Figure 1:
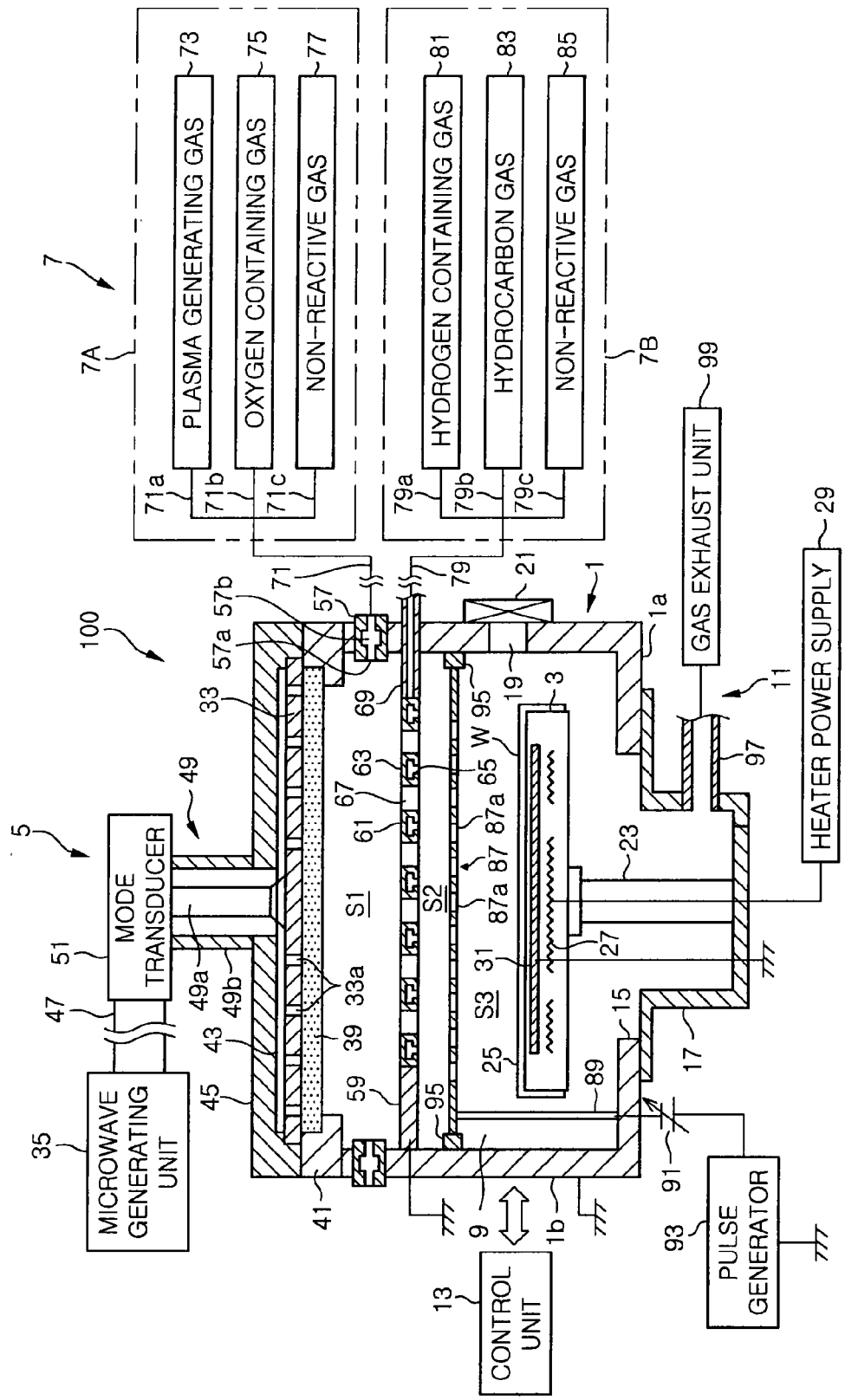
FIG. 1 is a cross sectional view schematically showing a configuration example of a carbon nanotube film forming apparatus in accordance with an embodiment of the present invention.

Hereinafter, an embodiment of the present invention will be described with reference to the accompanying drawings. FIG. 1 is a cross sectional view schematically showing an example of a film forming apparatus that can be used for a method for forming carbon nanotubes in accordance with an embodiment of the present invention. The film forming apparatus 100 shown in FIG. 1 is configured as a RLSA (Radial Line Slot Antenna) type microwave plasma processing apparatus capable of forming a uniform microwave plasma in a processing chamber by radiating a microwave through a plurality of microwave radiation holes of a planar antenna. The microwave plasma is a low electron temperature plasma mainly formed of radicals, and thus is suitable for a carbon nanotube forming process and an oxygen plasma process and an activation process as pre-processes for the carbon nanotube forming process.

The plasma processing apparatus 100 includes, as main elements, an approximately cylindrical processing chamber 1; a mounting table 3, provided in the processing chamber 1, for mounting thereon a semiconductor wafer (hereinafter, simply referred to as "wafer") W as a target object to be processed; a microwave introducing unit 5 for introducing a microwave into the processing chamber 1; a gas supply unit 7 for guiding a gas into the processing chamber 1; a charged particle controller 9 for controlling charged particles in a plasma generated in the processing chamber 1; a gas exhaust unit 11 for exhausting the processing chamber 1; and a control unit 13 for controlling each component of the film forming apparatus 100.

The processing chamber 1 is grounded and formed in an approximately cylindrical shape. The processing chamber 1 has a bottom wall 1a and a sidewall 1b. The processing chamber 1 is made of, e.g., aluminum or the like. A circular opening 15 is formed at a substantially central portion of the bottom wall 1b of the processing chamber 1, and a gas exhaust chamber 17 is provided in the bottom wall 1a to protrude downward and communicate with the opening 15. Provided in the sidewall 1b of the processing chamber 1 are a loading/unloading port 19 through which the wafer W is loaded and unloaded and a gate valve 21 for opening and closing the loading/unloading port 19.

The mounting table 3 is formed of ceramic, e.g., AlN or the like. The mounting table 3 is supported by a cylindrical supporting member 23 extending upwardly from a central bottom portion of the gas exhaust chamber 17, the supporting member 23 being made of ceramic. A guide ring 25 for guiding the wafer W is provided at an outer peripheral portion of the mounting table 3. Further, wafer support pins (not shown) for lifting the wafer W are provided in the mounting table 3 so as to protrude from and retreat into the top surface of the mounting table 3.

A resistance heater 27 is embedded in the mounting table 3. The heater 27 is powered from a heater power supply 29 to heat the mounting table 3, thereby heating the wafer W mounted thereon. Moreover, a thermocouple (not shown) is provided in the mounting table 3, so that the heating temperature of the wafer W can be controlled in a range from about 200° C. to 650° C. In addition, an electrode having a similar size to that of the wafer W is provided above the heater 27 in the mounting table 3. The electrode 31 is grounded.

The microwave introducing unit 5 includes: a planar antenna 33 provided at an upper portion of the processing chamber 1 and having a plurality of microwave radiation holes 33a; a microwave generating unit 35 for generating a microwave; a transmitting plate 28 made of a dielectric material; a frame-shaped member 41 provided at an upper portion of the processing chamber 1; a wave-retardation plate 43 made of a dielectric material, for controlling a wavelength of a microwave; a cover member 45 for covering the planar antenna 33 and the wave-retardation plate 43. The microwave introducing unit 5 further includes a waveguide 47 and a coaxial waveguide 49 for guiding a microwave generated by the microwave generating unit 35 to the planar antenna 33; and a mode transducer 51 provided between the waveguide 47 and the coaxial waveguide 49.

The transmitting plate 39 for transmitting a microwave therethrough is made of a dielectric material, e.g., quartz or ceramic such as $Al_2O_3$, AlN or the like. The transmitting plate 39 is supported by the frame-shaped member 41. A sealing member (not shown) such as an O-ring or the like is provided to airtightly seal a gap between the transmitting plate 28 and the frame-shaped member 41, thereby maintaining airtightness of the processing chamber 1.

The planar antenna 33 is a circular plate-shaped conductive member made of, e.g., a copper plate, an aluminum plate, a nickel plate or a plate of an alloy thereof which is plated with gold or silver. The planar antenna 33 is provided substantially in parallel with the top surface (the surface on which the wafer W is mounted) of the mounting table 3 above the transmitting plate 39 (outside the processing chamber 1). The planar antenna 33 is engaged with the end of the frame-shaped member 41.

The planar antenna 33 has a plurality of rectangular-shaped (slot-shaped) microwave radiation holes 33a through which the microwave is radiated. The microwave radiation holes 33a are formed in a predetermined pattern to extend through the planar antenna 31. Generally, the adjacent microwave radiation holes 33a are arranged in a predetermined shape (e.g., "T" shape). The microwave radiation holes 33a combined in pairs are wholly arranged in a concentric circular shape, a spiral shape, a radial shape or the like. A length and an arrangement interval of the microwave radiation holes 33a are determined based on the wavelength ($\lambda$g) of the microwave.

The wave-retardation plate 33 having a larger dielectric constant than that of the vacuum is provided on the planar antenna 33. Since the microwave has a longer wavelength in the vacuum, the wave-retardation plate 33 functions to shorten the wavelength of the microwave to adjust a plasma. For example, quartz, polytetrafluoroethylene resin, polyimide resin or the like may be used as the material of the wave-retardation plate 33.

The cover member 45 is provided to cover the planar antenna 33 and the wave-retardation plate 43. The cover member 45 is made of a metal material such as aluminum, stainless steel, or the like. The coaxial waveguide 49 is connected to a central portion of an upper wall (ceiling portion) of the cover member 45. The coaxial waveguide 49 includes an inner conductor 49a extending upward from the center of the planar antenna 33; and an outer conductor 49b provided around the inner conductor 49a. The mode transducer 51 is provided at the other end of the coaxial waveguide 49 and is connected to the microwave generating unit 35 through the waveguide 47. The waveguide 47 is a rectangular waveguide extending in a horizontal direction, and the mode transducer 51 functions to convert a microwave propagating in a TE mode in the waveguide 47 into a TEM mode microwave.

The gas supply unit 7 includes a shower ring 57 serving as a first gas inlet formed in a ring shape along the inner wall of the processing chamber 1; and a shower plate 59 serving as a second gas inlet provided below the shower ring 57 so as to horizontally partition the space in the processing chamber 1 into an upper space and a lower space.

The shower ring 57 has a gas injection hole 57a through which a gas is introduced into a space in the processing chamber 1; and a gas channel 57b connected to the gas discharge hole 57a. The gas channel 57b is connected to a first gas supply unit 7A through a gas supply line 71. The first gas supply unit 7A has three branch lines 71a to 71c branched from the gas supply line 71. The branch line 71a is connected to a plasma generating gas supply source 73 for supplying a plasma generating gas (e.g., Ar gas). The branch line 71b is connected to an oxygen-containing gas supply source 75 for supplying an oxygen-containing gas (e.g., $O_2$ gas) used for oxygen plasma treatment. The branch line 71c is connected to a non-reactive gas supply source 77 for supplying a non-reactive gas (e.g., $N_2$ gas).

Further, each of the branch lines 71a to 71c is provided with a flow rate control unit and/or a valve (not shown). As for the plasma generating gas, a rare gas or the like may be used, for example. As for the rare gas, Ar, Kr, Xe, He or the like may be used, for example. Among them, it is particularly preferable to use Ar capable of stably generating a plasma. As for the oxygen-containing gas, $O_2$, $H_2O$, $O_3$, $N_2O$ or the like may be used, for example. As for the non-reactive gas, $N_2$ or the like may be used, for example. The non-reactive gas supplied from the non-reactive gas supply source 77 is used as, e.g., a purge gas, a pressure control gas or the like.

The shower plate 59 has a gas distributing member 61 made of, e.g., aluminum or the like, and formed in a grid shape when viewed from the top. The gas distributing member 61 has a gas channel 63 formed in a grid-shaped main body thereof; and a plurality of gas injection holes 65 that are open in the gas channel 63 to face the mounting table 3. Further, the grid-shaped gas distributing member 61 has a plurality of through holes 67.

A gas supply path 69 that reaches the wall of the processing chamber 1 is connected to the gas channel 63 of the shower plate 59. The gas supply path 69 is connected to a second gas supply unit 7B through a gas supply line 79. The second gas supply unit 7B has three branch lines 79a to 79c branched from the gas supply line 79. The branch line 79a is connected to a hydrogen-containing gas supply source 81 for supplying a hydrogen-containing gas (e.g., $H_2$ gas) used for a hydrogen plasma process and a carbon nanotube forming process. The branch line 79b is connected to a hydrocarbon gas supply source 83 for supplying a hydrocarbon gas (e.g., ethylene gas ($C_2H_4$)) as a source gas for carbon nanotubes. The branch line 79c is connected to a non-reactive gas supply source 85 for supplying a non-reactive gas (e.g., $N_2$ gas).

Further, each of the branch lines 79a to 79c is provided with a flow rate control unit and/or a valve (not shown). As for the oxygen-containing gas, $H_2$, $NH_3$ or the like may be used, for example. As for the hydrocarbon gas, ethylene ($C_2H_4$), methane ($CH_4$), ethane ($C_2H_6$), propane ($C_3H_8$), propylene ($C_3H_6$), acetylene ($C_2H_2$) or the like may be used, for example. As for the non-reactive gas, $N_2$ or the like may be used, for example. The non-reactive gas supplied from the non-reactive gas supply source 85 is used as, e.g., a purge gas, a carrier gas or the like.

The charged particle controller 9 includes a grid electrode 87 serving as an electrode member; a holding member 89 for holding the grid electrode 87; a variable DC power supply 91 for applying a DC voltage to the grid electrode 87 through the holding member 89; and a pulse generator 93 for supplying a pulse signal to the variable DC power supply 91. The grid electrode 87 is made of a conductive material, e.g., stainless steel, titanium, molybdenum or the like.

Further, the grid electrode 87 is provided below the shower plate 59 so as to cover the wafer W on the mounting table 3. The grid electrode 87 has a plurality of through holes 87a. In that case, in order to increase an opening ratio, a plurality of circular through holes, for example, may be provided, and smaller through holes may be provided between the respective through holes. Moreover, the shape of the through holes 87a of the grid electrode 87 is not limited to a circular shape, and may be a grid shape or a mesh shape. The outer periphery of the grid electrode 87 reaches the vicinity of the inner wall of the processing chamber 1.

An insulating member 95 is provided between the grid electrode 87 and the inner wall of the processing chamber 1. The insulating member 95 serves to prevent a plasma from being leaked from the gap between the grid electrode 87 and the wall of the processing chamber 1. However, if the leakage of the plasma can be prevented, the gap may be formed between the grid electrode 87 and the inner wall of the processing chamber 1, and the insulating member 95 becomes unnecessary.

The grid electrode 87 allows passage of radicals and disturbs passage of charged particles such as electrons or ions that may damage the surface of the wafer W, thereby suppressing approach of charged particles to the wafer W. To that end, the grid electrode 87 is preferably disposed above the wafer W at a position spaced from the wafer W by, e.g., about 50 mm to 110 mm. By applying a DC voltage from the variable DC power supply 91 to the grid electrode 87, the charged particles passing through the through hole 87a of the grid electrode 87 are repelled or sucked. Accordingly, the straightforward movement of the charged particles is disturbed, and the approach of the charged particles such as electrons or ions to the wafer W can be more efficiently suppressed.

For example, the approach of the electrons to the wafer W can be suppressed by repelling the electrons and negative ions by applying a negative DC voltage to the grid electrode 87. In that case, the voltage may be applied to the grid electrode 87 in a pulse shape by applying a predetermined pulse from the pulse generator 93. Alternatively, a general DC voltage may be applied without generating a pulse.

The pulse generator 93 is used to apply a voltage to the grid electrode 87 in a pulse shape. By applying a pulse-shaped voltage to the grid electrode 87, the surface of the wafer W can be processed without being electrically charged. If a negative voltage is continuously applied to the grid electrode 87, positive ions are excessively accelerated, which may damage growing carbon nanotubes. Accordingly, it is preferable to apply a voltage while controlling a duty ratio of the voltage by the pulse generator 93.

The gas exhaust unit 11 includes the gas exhaust chamber 17; a gas exhaust line 97 provided at a side surface of the gas exhaust chamber 17; and a gas exhaust device 99 connected to the gas exhaust line 97. Although it is not illustrated, the gas exhaust device 99 has, e.g., a vacuum pump, a pressure control valve or the like.

Figure 2:
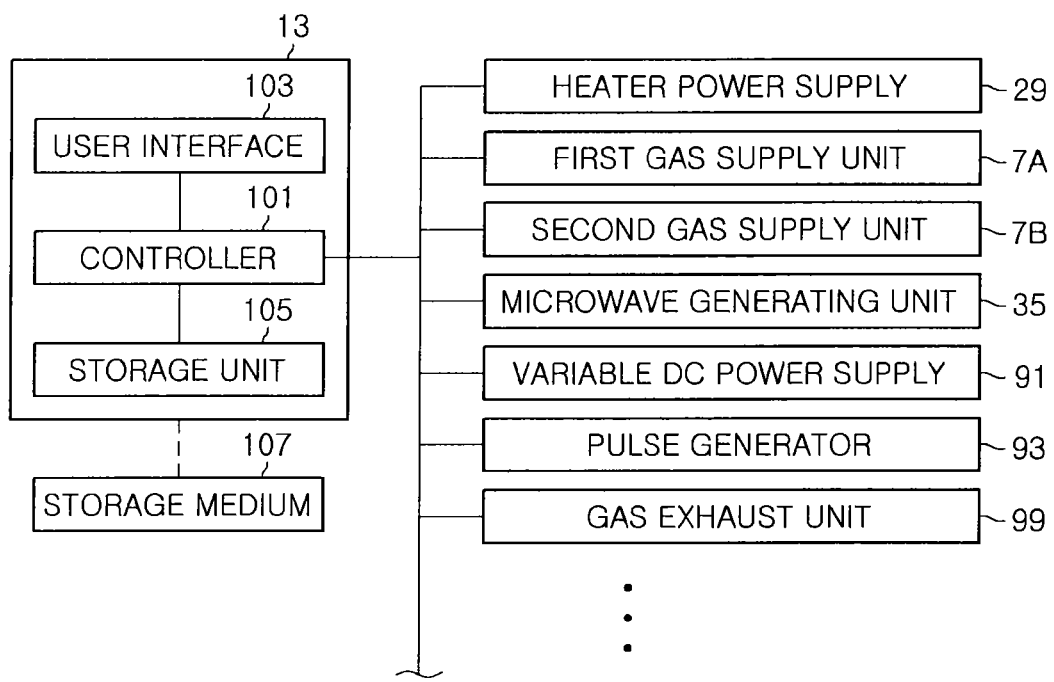
FIG. 2 explains a configuration example of a control unit of the film forming apparatus shown in FIG. 1.

Each component of the film forming apparatus 100 is controlled by the control unit 13. The control unit 13 is typically a computer. As shown in FIG. 2, the control unit 13 includes a controller 101 having a CPU; and a user interface 103 and a storage unit 105 which are connected to the controller 101. The controller 101 serves to integratedly control, in the film forming apparatus 100, the respective components (e.g., the heater power supply 29, the first gas supply unit 7A, the second gas supply unit 7B, the microwave generating unit 35, the variable DC power supply 91, the pulse generator 93, the gas exhaust device 99 and the like) which are associated with the processing conditions such as temperature, pressure, gas flow rate, microwave output, voltage applied to the grid electrode 87 and the like.

The user interface 103 includes a keyboard or a touch panel through which a process operator performs an input operation in accordance with commands in order to manage the film forming apparatus 100, a display for visually displaying an operational status of the film forming apparatus 100 and the like. Moreover, the storage unit 105 stores a recipe including process condition data or control programs (software) for performing various processes in the film forming apparatus 100 under the control of the controller 101.

Further, if necessary, a certain recipe is retrieved from the storage unit 105 in accordance with instructions inputted through the user interface 103 and executed by the controller 101. Accordingly, a desired process is performed in the processing chamber 1 of the film forming apparatus 100 under the control of the controller 101. Moreover, the recipe including process condition data or control programs may be stored in a computer-readable storage medium 107. The storage medium 107 may be, e.g., CD-ROM, hard disk, flexible disk, flash memory, or the like. Furthermore, the recipe may be transmitted from a separate device through, e.g., a dedicated line.

In the film forming apparatus 100, a plasma generating gas is introduced from the shower ring 57 into a space "S1" between the shower plate 59 and the transmitting plate 39 for introducing a microwave into the processing chamber 1 therethrough. Accordingly, the space S1 serves as a main plasma generating space in which a plasma is mainly generated.

In the processing chamber 1, a space "S2" between the shower plate 59 and the grid electrode 87 serves as a mixing space in which hydrogen gas or hydrocarbon gas introduced by the shower plate 59 is mixed with a plasma that has been generated in the space S1 and moved downward through the through holes 67 of the shower plate 59.

Besides, in the processing chamber 1, a space "S3" between the grid electrode 87 and the mounting table 3 serves as a diffusion space in which active species in the plasma passing through the through holes 87a of the grid electrode 87 are diffused toward the wafer W on the mounting table 3.

Figure 3:
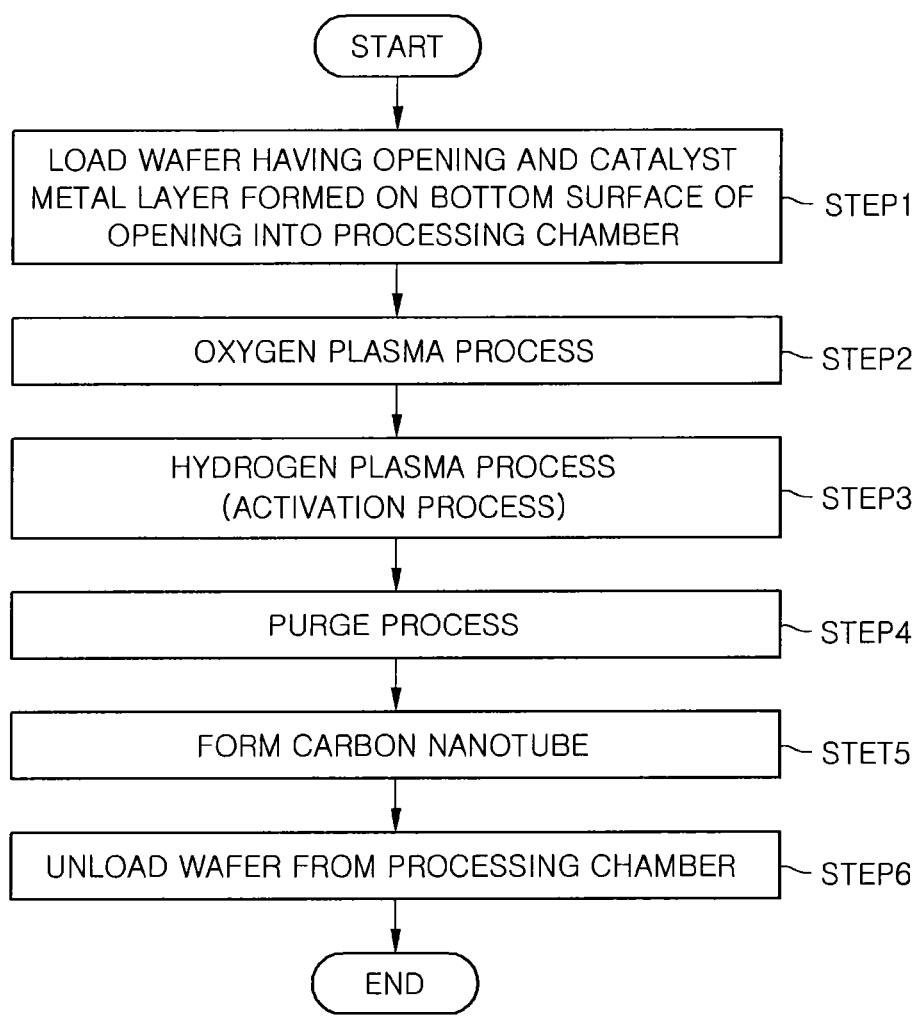
FIG. 3 is a flowchart showing a method for forming carbon nanotubes in accordance with the embodiment of the present invention.

Next, a method for forming carbon nanotubes which is performed in the film forming apparatus 100 will be described. FIG. 3 is a flowchart for explaining the method for forming carbon nanotubes in accordance with the embodiment of the present invention. Here, an oxygen plasma process and a hydrogen plasma process are included in preprocesses required for the carbon nanotube forming process. In this case, for example, Ar gas, $O_2$ gas, $H_2$ gas, $N_2$ gas and $C_2H_4$ gas are respectively used as the plasma generating gas, an oxygen-containing gas, a hydrogen-containing gas, an non-reactive gas (purge gas) and a hydrocarbon gas.

Figure 4:
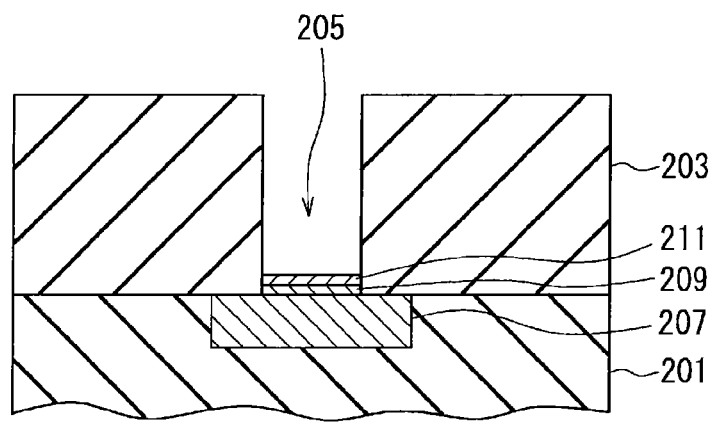
FIG. 4 schematically shows a structure of a wafer having a catalyst metal layer formed on a bottom of a recess as a target object to be processed.

First, in a step 1, a wafer W having an opening and a catalyst metal layer formed on a bottom surface of the opening is prepared and loaded into the processing chamber 1 by opening the gate valve 21. At this time, as shown in FIG. 4, the wafer W includes insulating layers 201 and 203 stacked on a top surface thereof, and a recess 205 as an opening is formed in the insulating layer 203. An underlying wiring 207 is formed in the insulating layer 201 and serves as a bottom wall of the recess 205. A base layer 209 and a catalyst layer 211 are stacked on the underlying wiring 207 formed on the bottom of the recess 205.

The recess 205 includes, e.g., a via hole, a wiring groove or the like. However, the recess 205 is not limited thereto. The recess 205 may be formed by a well-known photolithography technique and/or etching.

The base layer 209 serves as a film for preventing the coarsening caused by the agglomeration of catalyst metal. The base layer 209 may be made of, e.g., Al, Si, Ta, Ti, TaN, TiN, TiC, $Al_2O_3$, MgO or the like. The base layer 209 may be formed by a well-known film forming technique, e.g., sputtering, deposition, CVD (chemical vapor deposition), plating or the like. The base layer 209 preferably has a thickness in a range from, e.g., about 5 nm to 100 nm. When a barrier metal layer is formed in the recess 209, the barrier metal layer may be used as the base layer 209.

The metal of which the catalyst metal layer 211 is made may include a transition metal such as Ni, Co, Fe, Ru or the like, or an alloy containing such transition metal. The catalyst metal layer 211 may be formed by a well-known film forming technique, e.g., sputtering, deposition, CVD (chemical vapor deposition), plating or the like. The catalyst metal layer 211 preferably has a thickness in a range from, e.g., about 0.1 nm to 2.0 nm.

In the present embodiment, a depth/width ratio (aspect ratio) of the recess 205 where carbon nanotubes are filled is not particularly limited. However, it is set preferably in a range from, e.g., about 1 to 20, and more preferably from about 1 to 10. The width of the recess 205 is set in a range from, e.g., about 10 nm to 300 nm, preferably from about 20 nm to 300 nm, and more preferably from about 50 nm to 300 nm. Here, in the case that the recess 205 is an opening such as a via hole or the like, the width of the recess 205 as an opening denotes a diameter. In the case that the recess 205 is a wiring groove, the width of the recess 205 denotes a cross-sectional width.

Next, in a step 2, a wafer W having the same structure as that shown in FIG. 4 is loaded into the processing chamber 1 and mounted on the mounting table 3. Then, an oxygen plasma process is performed on a catalyst metal layer 211. In this process, the surface of the catalyst metal layer 211 is cleaned by removing organic materials and the like adhered thereto. In the step 2, Ar gas and $O_2$ gas are introduced into the processing chamber 1 from the shower ring 57 and, also, the microwave generated by the microwave generating unit 35 is guided in a predetermined mode to the planar antenna 33 through the waveguide 47 and the coaxial waveguide 49. Then, the microwave is introduced into the processing chamber 1 through the microwave radiation holes 33a of the planar antenna 33 and the transmitting plate 39. By turning Ar gas and $O_2$ gas into plasmas by the microwave, the oxygen plasma process is performed on the surface of the catalyst metal layer 211 formed on the surface of the wafer W.

By removing impurities such as organic materials and the like adhered to the metal surface by the oxygen plasma, the metal atoms are easily moved, and migration caused by heating occurs on the surface of the catalyst metal layer 211. Accordingly, the metal of which the catalyst metal layer 211 is made is properly agglomerated, and this may facilitate atomization. In other words, in the oxygen plasma process, an energy capable of allowing atoms on the metal surface to be moved is supplied to the catalyst metal layer 211 by using the heat and the plasma. As a consequence, the surface is turned into a state in which metal atoms form an island shape (referred to as "agglomeration"). At this time, a size of the island becomes smaller as the thickness of an initial film becomes smaller. For example, when the film thickness is about 1 nm, particles having a diameter of about 10 nm are generated. When the film thickness is about 2 nm, particles having a diameter of about 20 nm are generated.

The processing temperature of the oxygen plasma process which corresponds to the temperature of the wafer W is preferably set in a range from, e.g., about a room temperature (about 20° C.; the same hereinafter) to about 550° C. and more preferably from about a room temperature to about 350° C., in view of preventing scaling up of particles.

The pressure in the processing chamber 1 is preferably set in a range from, e.g., about 66.7 Pa to 400 Pa (about 0.5 Torr to 3 Torr) and more preferably from about 133 Pa to 266.6 Pa (about 1 Torr to 2 Torr), in view of generating a large amount of radicals in the plasma.

The $O_2$ gas flow rate is preferably is set in a range from, e.g., about 100 mL/min(sccm) to 500 mL/min(sccm) and more preferably from about 100 mL/min(sccm) to 200 mL/min(sccm), in view of suppressing excessive oxidation of the catalyst metal layer 211.

The Ar gas flow rate is preferably set in a range, e.g., about 0 mL/min(sccm) to 1000 mL/min(sccm) and more preferably from about 0 mL/min(sccm) to 200 mL/min(sccm), in view of increasing the efficiency of generating active species in the plasma.

The microwave power is preferably set in a range from, e.g., about 250 W to 2000 W and more preferably from about 500 W to 1000 W, in view of efficiently generating active species in the plasma.

The processing time is preferably set in a range from, e.g., about 10 sec to 20 min and more preferably from about 5 min to 10 min, in view of optimizing atomization and activation of the catalyst metal layer 211.

In the oxygen plasma process of the step 2, the grid electrode 87 serves as a member for suppressing the passage of charged particles. In other words, the grid electrode 87 suppress the approach of electrons or ions in the plasma to the catalyst metal layer 211 from on the surface of the wafer W and allows radicals to reach the catalyst metal layer 211. Accordingly, the metal of the catalyst metal layer 211 can be properly agglomerated without damaging the catalyst metal layer 211 by electrons or ions. Further, by applying a voltage to the grid electrode 87, the straightforward movement of charged particles such as electrons or ions is disturbed, so that the approach of charged particles to the wafer W is more efficiently suppressed. Therefore, it is possible to further increase the effect of optimizing agglomeration of the metal of the catalyst metal layer 211.

In the oxygen plasma process of the step 2, a diameter of the through holes 87a of the grid electrode 87 is preferably set from, e.g., about 0.5 mm to 2 mm and more preferably from about 0.5 mm to 1 mm, in view of more efficiently suppressing the approach of electrons to the wafer W. Further, the opening ratio is preferably set in a range, e.g., about 40% to 85%, in view of optimizing the approach of active specie from the plasma.

Here, the opening ratio denotes a percentage of a total area of openings of a plurality of through holes 87a to an area of the grid electrode 87 on the assumption that the grid electrode 87 has a flat surface having no opening. Further, the voltage applied to the grid electrode 87 is preferably set within a range from about −300 V to 300 V. In view of efficiently suppressing the approach of electrons to the wafer W, the voltage is preferably negative ranging from, e.g., about −300 V to 0 V.

Instead of $O_2$ gas, $H_2O$, $O_3$, $N_2O$ or the like may be used for a gas for the oxygen plasma process.

Next, the hydrogen plasma process is performed in a step 3. The hydrogen plasma process is performed after the step 2 and has a purpose of activating a catalyst metal by reducing the surface of the catalyst metal layer 211 by using a hydrogen plasma, the surface of the catalyst metal layer 211 being oxidized by the oxygen plasma process of the step 2. In the step 3, upon completion of the oxygen plasma process of the step 2, the supply of the microwave and $O_2$ gas are stopped. While Ar gas is supplied, the microwave is guided from the microwave generating unit 35 to the planar antenna 33 through the waveguide 47 and the coaxial waveguide 49, and then is introduced into the processing chamber 1 through the transmitting plate 39.

The Ar gas is turned into a plasma by the microwave. When the plasma is ignited, $H_2$ gas is introduced into the processing chamber 1 through the gas injection openings 65 of the shower plate 59 and turned into a plasma by the Ar plasma that has been moved downward through the through holes 67 of the shower plate 59. The hydrogen plasma process is performed on the surface of the catalyst metal layer 211 by the microwave plasma thus generated. By performing the hydrogen plasma process, the surface of the catalyst metal layer 211 is activated, and the metal of the catalyst metal layer 211 may be atomized and densified.

The processing temperature of the hydrogen plasma process, i.e., the temperature of the wafer W, is preferably set within a range from, e.g., about a room temperature to 550° C. and more preferably from about a room temperature to 350° C., in view of preventing scaling up of charged particles. Although the temperature of the hydrogen plasma process may be different from that of the oxygen plasma process, it is preferable to perform both processes at the same temperature in view of increasing a throughput.

The pressure in the processing chamber 1 is preferably set in a range from, e.g., about 66.7 Pa to 400 Pa (0.5 Torr to 3 Torr) and more preferably from about 66.7 Pa to 133 Pa, in view of generating a large amount of radicals in the hydrogen plasma.

The $H_2$ gas flow rate is preferably set in a range from, e.g., about 100 mL/min(sccm) to 2000 mL/min(sccm) and more preferably from about 300 mL/min(sccm) to 1200 mL/min (sccm), in view of efficiently generating active species in the plasma.

The Ar gas flow rate is preferably set in a range from, e.g., about 0 mL/min(sccm) to 1000 mL/min(sccm) and more preferably from about 0 mL/min(sccm) to 200 mL/min (sccm), in view of efficiently generating active species in the plasma.

The microwave power is preferably set in a range from, e.g., about 250 W to 2000 W and more preferably from about 500 W to 1000 W, in view of efficiently generating active species in the plasma.

The processing time is preferably set in a range from, e.g., about 10 sec to 20 min and more preferably from about 5 min to 10 min, in view of optimizing atomization and activation of the catalyst metal layer 211.

In the hydrogen plasma process of the step 3, the grid electrode 87 serves as a member for suppressing the passage of charged particles. In other words, the grid electrode 87 suppresses the approach of electrons or ions in the plasma to the catalyst metal layer 211 formed on the surface of the wafer W and allows radicals to reach the catalyst metal layer 211. Accordingly, the metal of the catalyst metal layer 211 is atomized and densified by activating the surface of the catalyst metal layer 211 mainly by the action of radicals without damaging the catalyst metal layer 211 by electrons or ions.

Further, by applying a voltage to the grid electrode 87, the straightforward movement of charged particles such as electrons or ions is disturbed, and the approach of the charged particles to the wafer W is more efficiently suppressed.

Besides, it is further increase the effect of atomizing and densifying the metal of the catalyst metal layer 211 by activating the surface of the catalyst metal layer 211.

In the hydrogen plasma process of the step 3, the diameter of the through holes 87a of the grid electrode 87 is preferably set in a range from, e.g., about 0.5 mm to 2 mm and more preferably from about 0.5 mm to 1 mm, in view of efficiently suppressing the approach of electrons to the wafer W. The opening ratio is preferably set in a range from, e.g., about 40% to 85%, in view of optimizing the approach of active species from the plasma. Further, the voltage applied to the grid electrode 87 is set in a range from about −300 V to 300 V. In view of efficiently suppressing the approach of electrons, the voltage is preferably negative ranging from, e.g., about −300 V to 0 V.

As for the gas used for the hydrogen plasma process, hydrogen-containing gas such as $NH_3$ gas or the like may be use instead of $H_2$ gas.

Next, the processing chamber 1 is purged in a step 4. In other words, upon completion of the hydrogen plasma process of the step 3, the supply of the microwave and $H_2$ gas is stopped and the processing chamber 1 is quickly exhausted by the gas exhaust device 99. Thereafter, Ar gas and $N_2$ gas are supplied. The purge process of the step 4 is preferably performed for about 1 min to 2 min while setting a pressure in the processing chamber 1 in a range from about 66.7 Pa to 400 Pa (about 0.5 Torr to 3 Torr), an $N_2$ gas flow rate in a range from about 50 mL/min(sccm) to 300 mL/min(sccm), an Ar gas flow rate in a range from about 300 mL/min(sccm) to 600 mL/min(sccm), and a temperature of the wafer W in a range from about 300° C. to 600° C.

By the purge process, the atmosphere in the processing chamber 1 (oxygen and hydrogen in the preprocess) is substituted by a non-reactive gas, and it is possible to shorten a period of time required to control a processing pressure. In addition, $N_2$ gas as a purge gas is introduced from the non-reactive gas supply source 77 via the shower ring 57.

Next, carbon nanotubes are formed in a step 5. In the carbon nanotube forming process, upon completion of the purge process of the step 4, the supply of $N_2$ gas is stopped and the microwave is guided from the microwave generating unit 35 to the planar antenna 33 through the waveguide 47 and the coaxial waveguide 49, and introduced into the processing chamber 1 through the transmitting plate 39 while Ar gas is supplied at a predetermined flow rate. Ar gas is turned into a plasma by the microwave.

Figure 5:
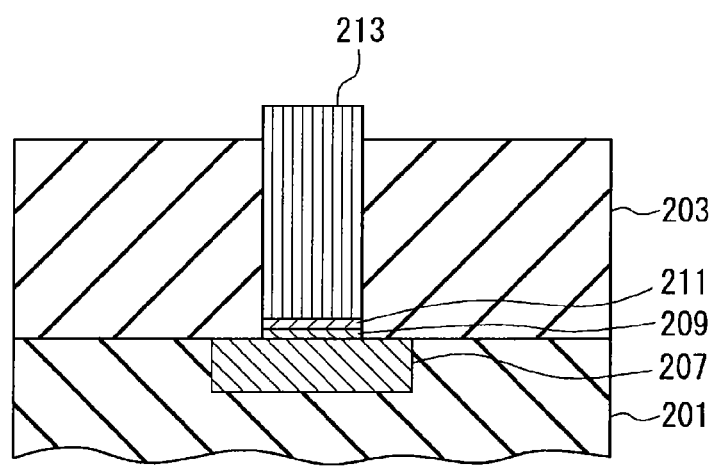
FIG. 5 schematically explains a state in which carbon nanotubes are filled in a recess.

When the plasma is ignited, $C_2H_4$ gas and $H_2$ gas are introduced into the processing chamber 1 through the gas injection openings 65 of the shower plate 59. Further, $C_2H_4$ gas and $H_2$ gas are turned into plasmas by the Ar plasma that has been moved downward through the through holes 67 of the shower plate 59. Moreover, carbon nanotubes are formed on the catalyst meal layer 211 by the microwave plasma while a predetermined voltage is applied to the grid electrode 87. Accordingly, as shown in FIG. 5, the recess 205 can be filled with the carbon nanotubes 213 with a high density.

In the formation of the carbon nanotubes 213 in the step 5, the carbon nanotubes 213 can be grown on the surface of the activated catalyst metal layer 211. In that case, the carbon nanotubes 213 are grown while maintaining the phase of the catalyst metal layer 211. By the hydrogen plasma process of the step 3, the high-density carbon nanotubes 213 can be formed on the catalyst metal layer 211 that has been activated and thus atomized and densified in the recess 205.

Moreover, the grid electrode 87 serving as a charged particle passage suppressing member suppresses the approach of electrons or ions in the plasma to the catalyst metal layer 211 formed on the surface of the wafer W and allows radicals to reach the catalyst metal layer 211. Therefore, it is possible form the carbon nanotube film having a good crystallinity and a small amount of impurities by preventing the catalyst metal layer 211 from being damaged by electrons or ions and suppressing crystal defects and introduction of impurities. Further, by applying a voltage to the grid electrode 87, the straightforward movement of the charged particles such as electron, ions or the like can be disturbed, and the approach of the charged particles to the wafer W can be efficiently suppressed. Moreover, it is possible to form the carbon nanotube film having a good crystallinity and a small amount of impurities.

The processing temperature of the growing process of the carbon nanotube 213, i.e., the temperature of the wafer W, is preferably set in a range from about 350° C. to 550° C., more preferably from about 350° C. to 530° C., and most preferably from about 350° C. to 450° C. in view of realizing a low temperature process. Although the temperature of the growing process of the carbon nanotube 213 may be different from those the oxygen plasma process (step 2) and the hydrogen plasma process (step 3), it is preferable to perform all processes at the same temperature in view of increasing a throughput. More preferably, the density of the carbon nanotubes 213 filled in the openings can be increased by setting the temperature of the growing process of the carbon nanotube 213 in a range from about 400° C. to 420° C.

The pressure in the processing chamber 1 is preferably set within a range from about 66.7 Pa to 400 Pa (0.5 Torr to 3 Torr) and more preferably within a range from about 266 Pa to 400 Pa in view of increasing the amount of generating radicals in the plasma.

The $C_2H_4$ gas flow rate is preferably set within a range, from about 5 mL/min(sccm) to 200 mL/min(sccm) and more preferably within a range from about 6 mL/min(sccm) to 30 mL/min(sccm) in view of efficiently generating active species in the plasma.

The $H_2$ gas flow rate is preferably set within a range from about 100 mL/min(sccm) to 2000 mL/min(sccm) and more preferably within a range from about 300 mL/min(sccm) to 1200 mL/min(sccm) in view of efficiently generating active species in the plasma.

The Ar gas flow rate is preferably set within a range from about 0 mL/min(sccm) to 1000 mL/min(sccm) and more preferably within a range from about 0 mL/min(sccm) to 200 mL/min(sccm) in view of efficiently generating active species in the plasma.

The microwave power is preferably set within a range from about 250 W to 2000 W and more preferably within a range from about 500 W to 1000 W in view of efficiently generating active species in the plasma.

The processing time is preferably set within a range from about 1 min to 60 min and more preferably within a range from about 1 min to 30 min in view of preventing the deterioration of catalyst activation.

In the growing process of the carbon nanotubes 213 of the step 5, a diameter of the through holes 87a of the grid electrode 87 is preferably set within a range from about 0.5 mm to 2 mm and more preferably within a range from about 0.5 mm to 1 mm in view of efficiently suppressing the approach of electrons to the wafer W. The opening ratio is preferably set in a range from, e.g., about 40% to 85%, in view of optimizing the approach of active species from the plasma. Further, the voltage applied to the grid electrode 87 is preferably set within a range from about −300 V to 300 V. In view of efficiently suppressing the approach of electrons to the wafer W, the voltage is preferably negative ranging, e.g., from about −300 V to 0 V. By setting the negative voltage applied to the grid electrode 87 in a range from about −300 V to −100 V, it is possible to facilitate the filling of the carbon nanotubes 213 in the recess 205.

In the growing process of the carbon nanotube 213, another hydrocarbon such as methane ($CH_4$) gas, ethane ($C_2H_6$) gas, propane ($C_3H_8$) gas, propylene ($C_3H_6$) gas, acetylene ($C_2H_2$) gas or the like may be used instead of ethylene ($C_2H_4$) gas. The reduction gas is not limited to $H_2$ gas, and may be another gas such as ammonia ($NH_3$) or the like. Moreover, a non-reactive gas such as $N_2$ gas or the like may be used as a carrier gas or a pressure control gas.

Next, in a step 6, upon completion of the formation of the carbon nanotube 213, the supply of the microwave and the gas is stopped, and the pressure in the processing chamber 1 is controlled. Then, the wafer W is unloaded by opening the gate valve 21.

Figure 6A:
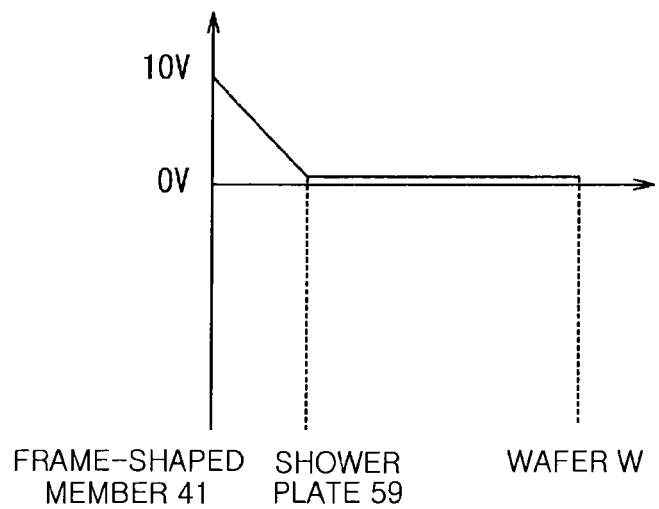
FIG. 6A shows a space potential in a processing chamber when no voltage is applied to a grid electrode.
Figure 6B:
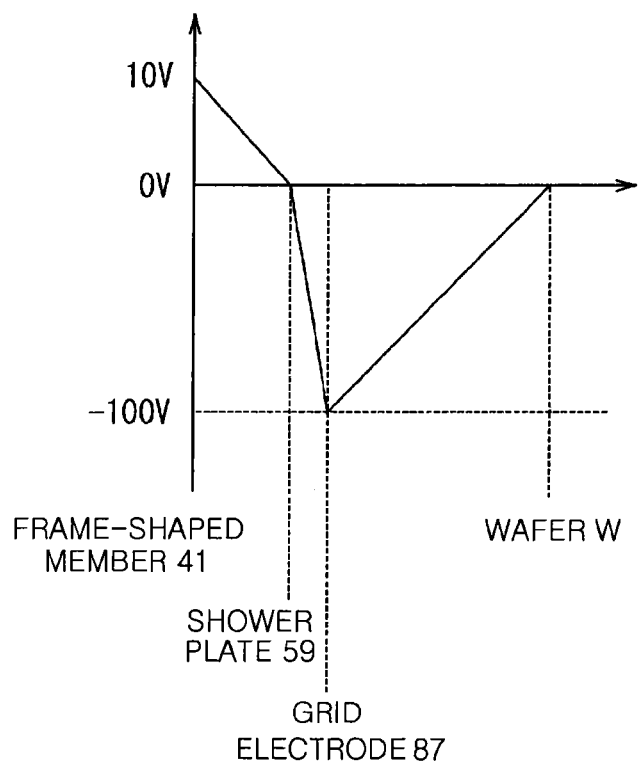
FIG. 6B shows a space potential in a processing chamber when a voltage is applied to a grid electrode.

Here, the mechanism of applying a voltage to the grid electrode 87 will be described with reference to FIGS. 6A and 6B. FIG. 6A shows a spatial potential in the processing chamber 1 when no voltage is applied to the grid electrode 87. FIG. 6B shows a spatial potential in the processing chamber 1 when a voltage of about −100 V is applied to the grid electrode 87. When no voltage is applied to the grid electrode 87, a potential difference does not occur between the shower plate 59 and the wafer W, so that the electrical action does not occur in the charged particles such as electrons or ions as shown in FIG. 6A.

On the other hand, when the voltage of about −100V is applied to the grid electrode 87, the grid electrode 87 has a negative potential with respect to the grounded shower plate 59 and the wafer W (the mounting table 3), so that the negatively charged particles such as electrons or negative ions hardly reach the wafer W, as shown in FIG. 6B.

Figure 7:
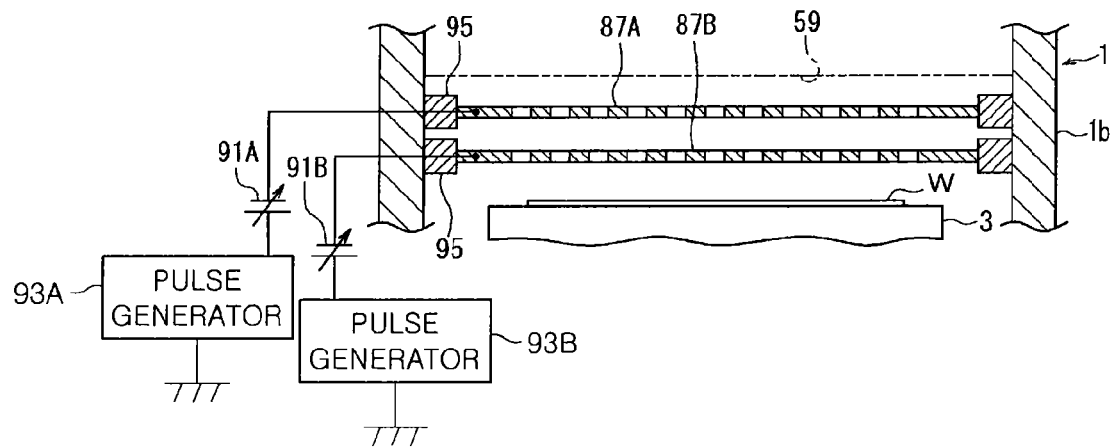
FIG. 7 is a cross sectional view showing main parts in a modification of the film forming apparatus of FIG. 1.

In FIG. 1, one grid electrode 87 is provided at the charged particle controller 9. However, a plurality of grid electrode 87 may be provided. For example, as shown in FIG. 7, two grid electrodes 87A and 87B may be vertically disposed in two stages. The structures of the grid electrodes 87A and 87B are the same as that shown in FIG. 1. Although insulating members 95 may be provided between the processing chamber 1 and the grid electrodes 87A and 87B as shown in FIG. 1, they are not necessarily provided. By using two or more grid electrodes 87, it is possible to further increase the effect of selectively allowing the passage of the charged particles such as electrons, ions or the like.

In the configuration example shown in FIG. 7, variable DC power supplies 91A and 91B and pulse generators 93A and 93B are connected to the grid electrodes 87A and 87B, respectively. By applying a voltage to one of or both of the grid electrodes 87A and 87B, it is possible to more efficiently prevent the approach of charged particles such as electrons, ions and the like to the wafer W. In the carbon nanotube forming process, carbon nanotubes having a good crystallinity and a small amount of impurities can be formed by providing two or more grid electrodes 87 compared to the case of providing one grid electrode 87. In the oxygen plasma process and the hydrogen plasma process, by providing two or more grid electrodes 87, it is also possible to further improve the effect of optimizing the agglomeration of the metal of the catalyst metal layer and the effect of activating and thus atomizing and densifying the metal of the catalyst metal layer 211.

Figure 8:
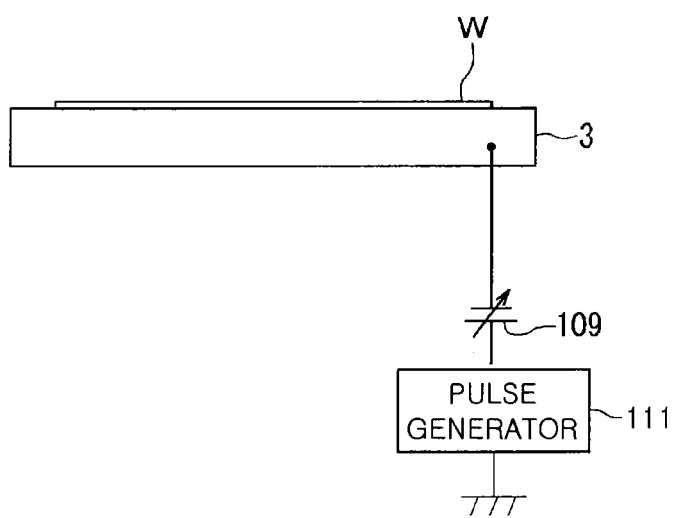
FIG. 8 shows another modification of the film forming apparatus of FIG. 1.

As for another configuration example of the charged particle control unit for suppressing the approach of charged particles such as electrons, ions or the like to the wafer W, there may be employed an configuration example in which a variable DC power supply 109 and a pulse generator 111 are connected to the mounting table 3 as shown in FIG. 8. In that case, by applying a negative DC voltage to the mounting table 3, the wafer W has a negative voltage. Therefore, electrons and negative ions are repelled and hardly approach the surface of the wafer W.

Hereinafter, test examples will be described for explaining the embodiment of the present invention in detail. However, the present embodiment is not limited by such test examples.

TEST EXAMPLE 1

Figure 9:
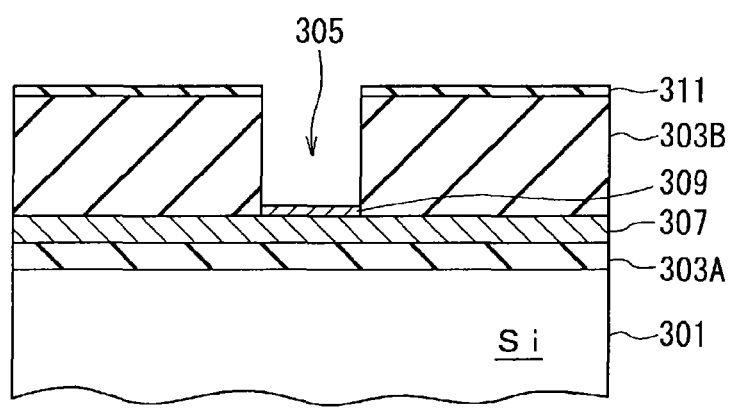
FIG. 9 schematically shows a structure of a wafer used in Test Examples.

As shown in FIG. 9, there was used a wafer W in which a recess, i.e., a circular hole, 305 having a diameter of about 200 nm, was formed as an opening in an upper $SiO_2$ layer 303B on a lower $SiO_2$ layer 303A stacked on a Si substrate 301. A base layer 307 made of TiN was formed between the $SiO_2$ layers 303A and 303B, the base layer 307 having a depth of about 70 nm, and a Ni catalyst layer 309 was formed on the base layer 307, the Ni catalyst layer 309 having a depth of about 2 nm in the bottom surface of the recess 305. Further, a SiCN layer 311 was formed on the surface of the $SiO_2$ layer 303B.

This wafer W was loaded into a processing chamber of a film forming apparatus having the same configuration as that of the film forming apparatus 100 shown in FIG. 1, and then was subjected to oxygen plasma process and hydrogen plasma process in that order under the following conditions. Then, the processing chamber was purged, and carbon nanotubes were grown in the recess 305. The grid electrode used in the test was made of stainless steel and had through holes having a diameter of about 2 mm and a height (thickness of the grid electrode) of about 0.1 mm.

Figure 10A:
FIGS. 10A to 10D are scanning electron microscope (SEM) images showing a cross section of a substrate, which are results of tests of forming carbon nanotubes at about 400° C., 420° C., 380° C. and 440° C., respectively, in Test Example 1.
Figure 10B:
Figure 10C:
Figure 10D:
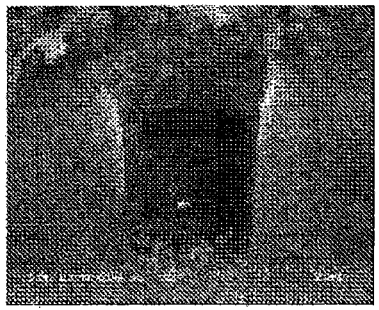

<Oxygen Plasma Process Conditions>
Processing temperature: 400° C.
Processing pressure: 267 Pa(2 Torr)
Processing gas:
$O_2$ gas 100 mL/min(sccm)
Ar gas 450 mL/min(sccm)
Microwave power: 1 kW
Voltage applied to grid electrode: 0 V
Processing time: 10 min
<Hydrogen Plasma Process Conditions>
Processing temperature: 400° C.
Processing pressure: 66.7 Pa(0.5 Torr)
Processing gas:
$H_2$ gas 462 mL/min(sccm)
Ar gas 450 mL/min(sccm)
Microwave power: 1 kW
Voltage applied to grid electrode: 0 V
Processing time: 30 sec
<Purge Process Conditions>
Processing temperature: 400° C.
Processing pressure: 400 Pa(3 Torr)
Processing gas:
$N_2$ gas 200 mL/min(sccm)
Ar gas 450 mL/min(sccm)
Voltage applied to grid electrode: 0 V
Processing time: 2 min
<Carbon Nanotube Growing Process Conditions>
Processing temperature: 380° C., 400° C., 420° C., 440° C.
Processing pressure: 400 Pa(3 Torr)
Processing gas:
$C_2H_4$ gas 6.3 mL/min(sccm)
$H_2$ gas 370 mL/min(sccm)
Ar gas 450 mL/min(sccm)
Microwave power: 0.5 kW
Voltage applied to grid electrode: −100 V
Processing time: 30 min FIGS. 10A to 10D are scanning electron microscope (SEM) images showing cross sections of carbon nanotubes grown under the above-described conditions. FIGS. 10A and 10B show the cases where the processing temperatures of the carbon nanotube growing process were about 400° C. and 420° C. As illustrated in the drawings, when the processing temperatures were about 400° C. to 420° C., carbon nanotubes were filled in the opening (recess) with a high density. On the other hand, FIGS. 10C and 10D show the cases where the processing temperatures of the carbon nanotube growing process were about 380° C. and 440° C. Under such conditions, the growing speed of the carbon nanotubes was lower compared to the cases shown in FIGS. 10A and 10B.

TEST EXAMPLE 2

Next, the effect of a voltage applied to a grid electrode was examined. Carbon nanotubes were grown by varying a voltage applied to the grid electrode while using an apparatus and a method which are identical to those of the test Example 1. In this Test Example, a voltage of about −100 V or −300 V was applied to the grid electrode in a state where a processing temperature of the carbon nanotube growing process was set to about 470° C. Other conditions are the same as those of the test Example 1. FIGS. 11A and 11B show SEM images of a cross section of carbon nanotubes when voltages of about −100 V and −300 V, respectively, are applied to the grid electrode. These results show that the packing density of the carbon nanotubes can be increased by increasing the negative voltage applied to the grid electrode.

TEST EXAMPLE 3

Next, the case in which an apparatus and a method which are identical to those of the Test Example 1 were used and an opening on a target object to be processed is formed in a straight line-like shape (horizontally elongated groove) was examined. In this Test Example, carbon nanotubes were grown by applying a voltage of about −100 V to the grid electrode under the conditions same as those of the Test Example 1 except that a substrate in which a groove as an opening has a width of about 100 nm was used and the processing temperature of a carbon nanotube growing process was set to about 420° C. As a result, the carbon nanotubes were filled in the groove at a high filling ratio as shown in FIG. 12. In other words, the carbon nanotubes can be filled in an opening for a trench groove as well as an opening for a via hole.

The above test results show that the carbon nanotubes can be formed in the recess with a high density by performing oxygen plasma process and the hydrogen plasma process (activation process) on openings of a wafer having a catalyst metal layer and then performing plasma CVD thereon while controlling conditions such as a processing temperature, a voltage applied to the grid electrode 87, and the like, by using the microwave plasma film forming apparatus 100.

As described above, the plasma CVD is performed after the oxygen plasma process and the hydrogen plasma process (activation process) are performed on the wafer W having an opening and a catalyst metal layer on a bottom of the opening. Hence, the carbon nanotubes can be grown in the openings with a high density. In other words, in the oxygen plasma process, the surface of the catalyst metal layer formed on the bottom of the opening is purified, so that migration can be easily occur by heating. Next, the surface of the catalyst metal layer is activated by performing the hydrogen plasma process (activation process). Accordingly, the metal of the catalyst metal layer is atomized and densified. As such, by growing carbon nanotubes on the atomized and densified catalyst metal layer, the carbon nanotubes can be filled in the recesses with a high density.

In the film forming apparatus shown in FIG. 1, the grid electrode 87 is provided between the shower plate 59 and the wafer W. Therefore, radicals mainly act on the catalyst metal layer, and crystal defects or introduction of impurities can be suppressed. As a result, carbon nanotubes having a good crystallinity and a small amount of impurities can be formed. Such effect can be further improved by applying a voltage to the grid electrode 87.

In the present embodiment, by using the microwave plasma, the plasma process can be performed mainly by radicals having a low electron temperature at a high density. Therefore, the above-described advantages can be effectively obtained. Particularly, the process can be performed without disturbing the growth of carbon nanotubes by using an RLSA microwave plasma type film forming apparatus 100 capable of generating a plasma having a high density and a low electron temperature among microwave plasmas.

While the invention has been shown and described with respect to the embodiments, it will be understood by those skilled in the art that various changes and modification may be made without departing from the scope of the invention. For example, in the above-described embodiments, the oxygen plasma process, the activation process, the activation process, and the carbon nanotube forming process are carried out by the plasma processing apparatus using an RLSA microwave plasma. However, another microwave plasma may also be used. In addition, another plasma such as an inductively coupled plasma, a capacitively coupled plasma or the like may be used without being limited to the microwave plasma.

In the above embodiments, there was used the film forming apparatus 100 capable of efficiently and continuously performing oxygen plasma process, hydrogen plasma process (activation process) and the carbon nanotube forming process in a single processing chamber. However, the oxygen plasma process, the hydrogen plasma process (activation process) and the carbon nanotube forming process may be performed in different processing chambers. In that case, there may be used a multi chamber type film forming apparatus (cluster apparatus) capable of continuously processing a single wafer W sequentially loaded into and unloaded from processing chambers used for respective processes under the vacuum condition.

The structure of the wafer W and the shape of the opening or the wiring are not limited to those shown in FIG. 4. A substrate as a target object to be processed is not limited to a semiconductor and may also be, e.g., a substrate for a flat panel display, a substrate for a solar cell, or the like.

This application claims priority to Japanese Patent Application No. 2010-105456 filed on Apr. 30, 2010, the entire contents of which are incorporated herein by reference.

What is claimed is:

1. A method for forming carbon nanotubes, the method comprising:
    preparing a target object to be processed having a surface on which one or more openings are formed, each of the openings having a catalyst metal layer on a bottom thereof;
    agglomerating metal atoms in the catalyst metal layer by performing an oxygen plasma process on a surface of the catalyst metal layer such that migration of the metal atoms occurs on said surface of the catalyst metal layer;
    activating the catalyst metal layer by performing a hydrogen plasma process on the catalyst metal layer subjected to the oxygen plasma process, to thereby reduce the catalyst metal layer oxidized by the oxygen plasma process;
    substituting, after said activating, an atmosphere in which the target object is placed by a non-reactive gas; and then
    filling carbon nanotubes in the openings on the target object subjected to the oxygen plasma process and the hydrogen plasma process, wherein said filling is carried out by providing an electrode member having a plurality of through-holes above the target object in a processing chamber of a film forming apparatus and then growing the carbon nanotubes by plasma CVD on the activated catalyst metal layer by generating a plasma of a source gas in a space above the electrode member and diffusing active species in the plasma of the source gas toward the target object through the through-holes while applying a DC voltage to the electrode member, said non-reactive gas being employed as a carrier gas in said filling carbon nanotubes in the openings on the target object,
    wherein said substituting the atmosphere in which the target object is placed and said filling carbon nanotubes in the openings on the target object are performed under processing pressures ranging from about 66.7 Pa to 400 Pa.

2. The method of claim 1, wherein a DC voltage ranging from about −300 V to 0 V is applied to the electrode member.

3. The method of claim 1, wherein a diameter of the through-holes of the electrode member ranges from about 0.5 mm to 2 mm.

4. The method of claim 1, wherein, when the carbon nanotubes are grown, the target object is heated to about 350° C. to 550° C.

5. The method of claim 1, wherein the film forming apparatus includes:
    a first gas inlet for introducing a plasma generating gas into the processing chamber; and
    a second gas inlet for introducing the source gas into the processing chamber, the second gas inlet having a plurality of through-holes and being provided between the first gas inlet and the electrode member,
    wherein a plasma of the plasma generating gas is generated in a space above the second gas inlet, and the plasma of the plasma generating gas passes through the through-holes of the second gas inlet and is mixed with the source gas in a space between the second gas inlet and the electrode member to generate the plasma of the source gas, and
    wherein, after the source gas is mixed with the plasma of the plasma generating gas, the active species in the plasma of the source gas pass through the through-holes of the electrode member.

6. The method of claim 5, wherein a pulsed DC voltage is applied to the electrode member.

7. The method of claim 6, wherein at least one of said agglomerating, said activating and said filling includes applying a DC voltage to a mounting table on which the target object is mounted.

8. The method of claim 7, wherein a pulsed DC voltage is applied to the mounting table.

9. The method of claim 5, wherein at least one of said agglomerating, said activating and said filling includes applying a DC voltage to a mounting table on which the target object is mounted.

10. The method of claim 9, wherein a pulsed DC voltage is applied to the mounting table.

11. The method of claim 1, wherein the plasma used for the oxygen plasma process, the hydrogen plasma process and the carbon nanotube growing process is a microwave plasma.

12. The method of claim 11, wherein the microwave plasma is excited by a microwave introduced into the processing chamber by a planar antenna having a plurality of microwave radiation holes.

13. The method of claim 1, wherein the opening of the target object is a via hole or a wiring groove.

14. The method of claim 1, wherein the opening has a width ranging from about 10 nm to 300 nm.

15. The method of claim 1, wherein the oxygen plasma process, the hydrogen plasma process and the carbon nanotube growing process are successively performed in the same processing chamber.

16. The method of claim 1, wherein a pulsed DC voltage is applied to the electrode member.

17. The method of claim 16, wherein at least one of said agglomerating, said activating and said filling includes applying a DC voltage to a mounting table on which the target object is mounted.

18. The method of claim 17, wherein a pulsed DC voltage is applied to the mounting table.

19. The method of claim 1, wherein at least one of said agglomerating, said activating and said filling includes applying a DC voltage to a mounting table on which the target object is mounted.

20. The method of claim 19, wherein a pulsed DC voltage is applied to the mounting table.

* * * * *